US006929336B2

United States Patent
Liu et al.

(10) Patent No.: US 6,929,336 B2
(45) Date of Patent: Aug. 16, 2005

(54) RETAINING ASSEMBLY FOR RACK CABINET

(75) Inventors: Alvin Liu, Tu-chen (TW); Chen-Lu Fan, Tu-chen (TW); Li-Ping Chen, Tu-chen (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 90 days.

(21) Appl. No.: 10/452,434

(22) Filed: May 30, 2003

(65) Prior Publication Data

US 2004/0188362 A1 Sep. 30, 2004

(30) Foreign Application Priority Data

Mar. 28, 2003 (TW) ........................................ 92204916 U

(51) Int. Cl.$^7$ .............................................. A47B 88/00
(52) U.S. Cl. .................................. 312/223.1; 312/334.4
(58) Field of Search ........................... 312/223.1, 334.4, 312/334.5, 265.4, 265.1, 334.8, 350; 361/725, 726, 727, 683, 685; 211/26; 248/220.43, 220.41, 220.22, 295.11

(56) References Cited

U.S. PATENT DOCUMENTS

| | | | | |
|---|---|---|---|---|
| 5,209,356 A | * | 5/1993 | Chaffee | ........................ 211/26 |
| 5,424,912 A | * | 6/1995 | Mikan | ......................... 361/680 |
| 6,070,957 A | * | 6/2000 | Zachrai | .................... 312/334.4 |
| 6,230,903 B1 | * | 5/2001 | Abbott | .......................... 211/26 |
| 6,398,041 B1 | * | 6/2002 | Abbott | .......................... 211/26 |
| 6,481,809 B1 | * | 11/2002 | Richardson | .............. 312/223.2 |
| 6,600,656 B1 | * | 7/2003 | Mori et al. | .................. 361/724 |
| 6,644,481 B2 | * | 11/2003 | Dean et al. | ................... 211/26 |
| 6,659,292 B2 | * | 12/2003 | Gough et al. | ................. 211/26 |
| 6,726,164 B1 | * | 4/2004 | Baiza et al. | ........... 248/222.12 |
| 2002/0084734 A1 | * | 7/2002 | Shih | ......................... 312/334.4 |

* cited by examiner

*Primary Examiner*—Janet M. Wilkens
(74) *Attorney, Agent, or Firm*—Wei Te Chung

(57) ABSTRACT

A retaining assembly includes a cabinet (70), a first rail assembly located in the cabinet, a pair of metal plates (30) attached on the first rail assembly, a server (60), a second rail assembly attached to two sides of the server, two fastening plates (50) attached to the two sides of the server and two thumbscrews (90). A plurality of threaded holes (72) is defined in two sidewalls of the cabinet. Two first protrusions (14) are provided in the first rail assembly. Each metal plate has two positioning holes (32) and a fixing hole (34). The first protrusions engagably extend through the positioning holes respectively. Each fastening plate has an inserting hole (56) corresponding to the fixing hole of the metal plate. The thumbscrews are inserted through corresponding inserting holes of the metal plates to engage in corresponding fixing holes of the metal plates.

18 Claims, 9 Drawing Sheets

RETAINING ASSEMBLY FOR RACK CABINET

BACKGROUND OF THE INVENTION

1. Field of the Invention

The present invention relates to a retaining assembly for a rack cabinet, and particularly to a retaining assembly employing low-cost conventional screws.

2. Prior Art

Referring to FIGS. 8 and 9, a conventional server 600 is mounted to a cabinet 700 by four rail brackets 100, two outer rails 620 positioned in the brackets 100, two inner rails (not shown) fixed to opposite sides of the server 600 respectively, two fixing plates 500 attached to the opposite sides of the server 600 respectively, a plurality of screws 800 and two float screws 900. Each rail bracket 100 comprises two shoulders 120, and a mounting portion 180. Each rail bracket 100 is fastened to the cabinet 700 by inserting the screws 800 through the shoulders 120 to engage in corresponding threaded holes (not labeled) in the cabinet 700. A pair of float screws 900 is attached to the fixing plates 500. The server 600 is inserted into the cabinet 700, and the float screws 900 are engaged in corresponding threaded holes (not labeled) of the mounting portion 180 of the rail brackets 100. Thus the server 600 is fastened in the cabinet 700. However, the float screws 900 are relatively expensive.

Thus, a retaining assembly for fastening a server to a cabinet which is cost-efficient is desired.

SUMMARY OF THE INVENTION

Accordingly, an object of the present invention is to provide a retaining assembly for a rack cabinet which is relatively inexpensive.

To achieve the above-mentioned object, a retaining assembly in accordance with the present invention comprises a cabinet, a first rail assembly, a pair of metal plates, a server, a second rail assembly, two fastening plate and two thumbscrews. A plurality of threaded holes is defined in both front and rear ends of two sidewalls of the cabinet. The first rail assembly comprises two pair of rail brackets located in said two sidewalls. Each pair of rail brackets comprises two rail brackets located in front and rear portions of a respective sidewall. Each rail brackets located in the front portion of the cabinet has two first protrusions. Each metal plate comprises a base portion and a fixing portion offset from the base portion. Two positioning holes is defined in two sides of the base portion corresponding to the first protrusions, a fixing hole is defined in the fixing portion. The second rail assembly is attached on two sides of the server for engaging with the first rail assembly. The fastening plates are attached to the two sides of the serve in a front of a corresponding second rail assembly respectively. Each fastening plate defines an inserting hole corresponding to the fixing hole of the metal plate. The thumbscrews are inserted through corresponding inserting holes of the metal plates to engage in corresponding fixing holes of the metal plates.

Other objects, advantages and novel features of the present invention will be drawn from the following detailed description of a preferred embodiment of the present invention with the attached drawings, in which:

DESCRIPTION OF THE PREFERRED EMBODIMENT

Figure 1:
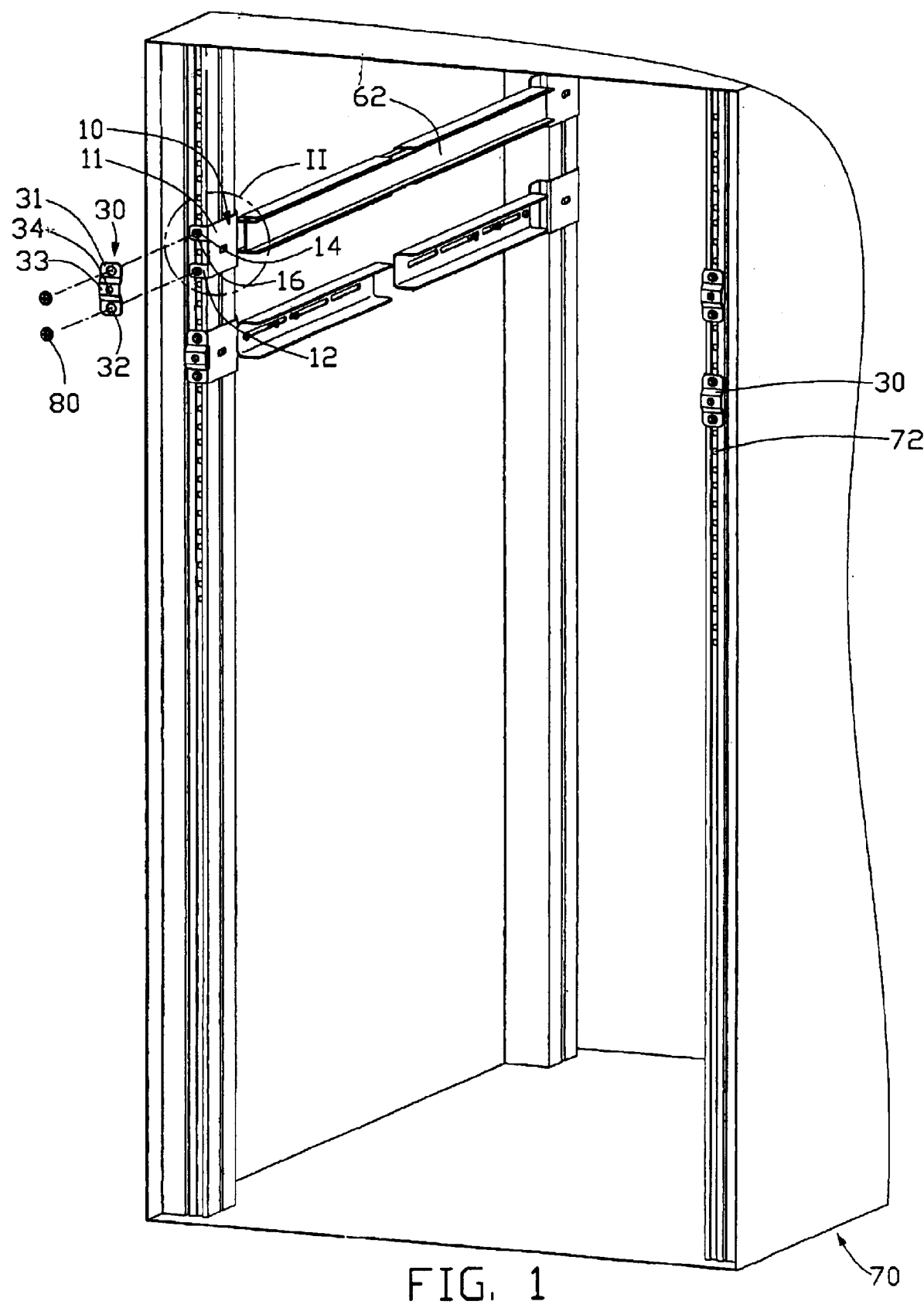
FIG. 1 is an assembled, isometric view of a cabinet, a first rail assembly, a plurality of screws and a plurality of metal plates all of a retaining assembly in accordance with the preferred embodiment of the present invention.
Figure 4:
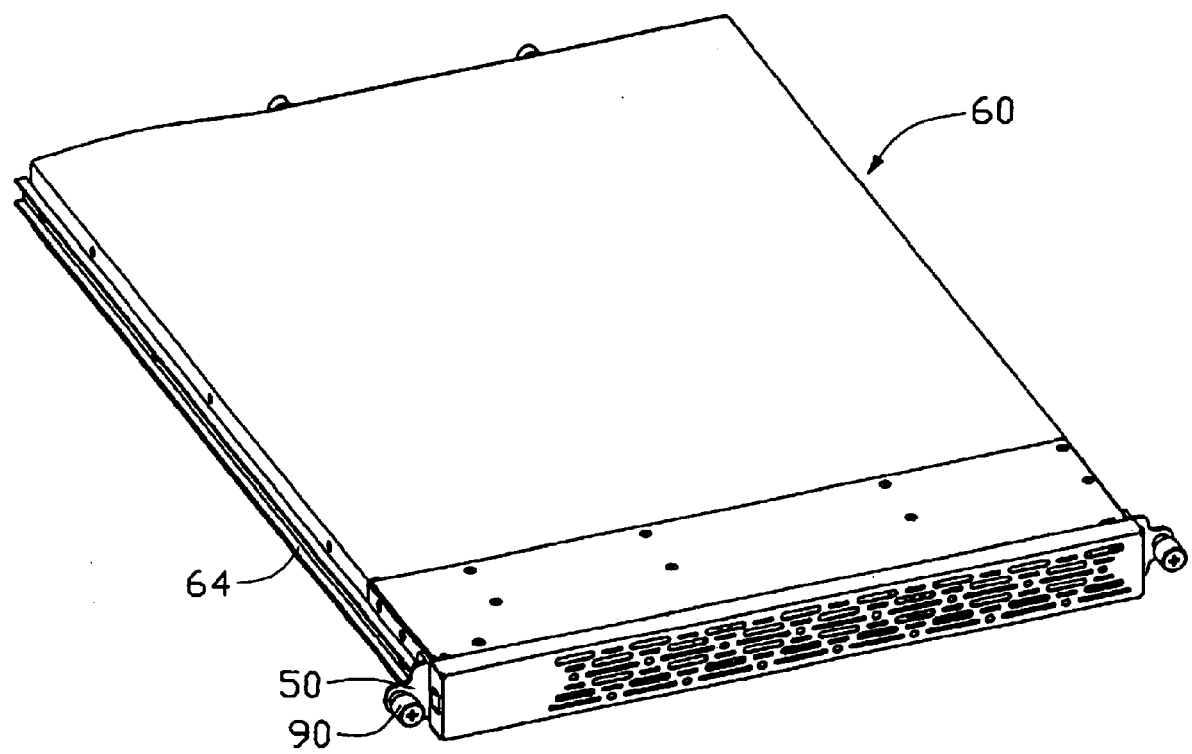
FIG. 4 is an assembled, isometric view of a server, a second rail assembly, a pair of fastening plates and a pair of thumbscrews all of the retaining assembly in accordance with the preferred embodiment of the present invention.

Referring to FIGS. 1 and 4, a retaining assembly for a rack cabinet in accordance with the present invention comprises a cabinet 70, a first rail assembly, a second rail assembly, a plurality of screws 80, a server 60, a pair of metal plates 30, a pair of fastening plates 50, and a pair of thumbscrews 90.

Figure 2:
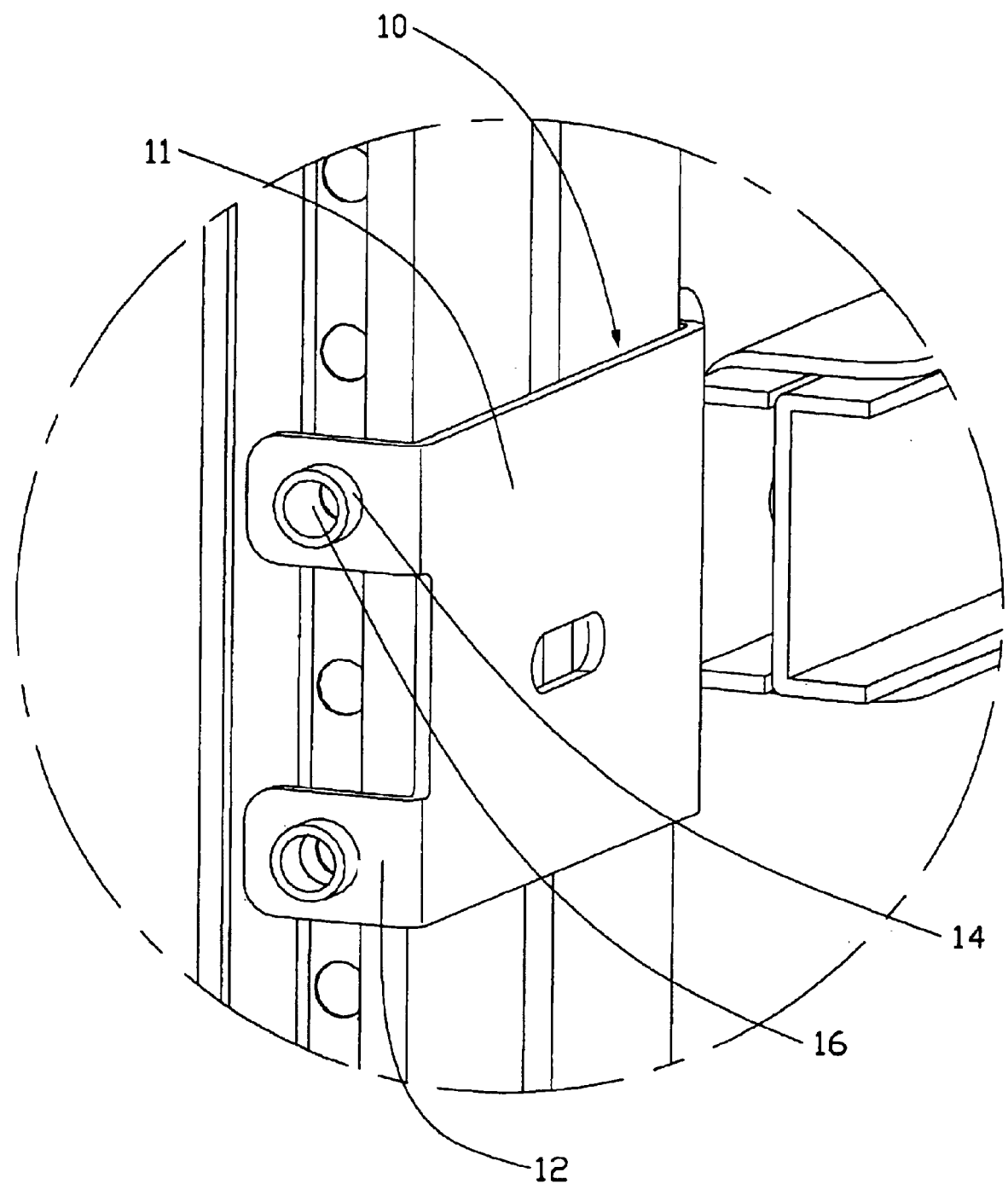
FIG. 2 is an enlarged view of a circled portion II of FIG. 1.

Referring to FIGS. 1 and 2, a plurality of threaded holes 72 is defined in front and rear ends of two sidewalls of the cabinet 70.

The first rail assembly comprises a group of rail brackets 10 positioned in the cabinet 70, a pair of outer rails 62, and a plurality of screws 80. Each group of rail brackets 10 comprises two pairs of rail brackets 10, each pair of rail brackets 10 being located in a respective one of opposite sides of the cabinet 70. Each pair of rail brackets 10 comprises two rail brackets 10 located at front and rear portions respectively of a respective side of the cabinet 70. Each rail bracket 10 comprises a main body 11, and two spaced shoulders 12 extending from an end of the main body 11. A first protrusion 14 projects outwardly from each shoulder 12. A through hole 16 is defined in each first protrusion 14.

Each outer rail 62 comprises two interconnected parts (not labeled) that are slidable relative to each other. Each outer rail 62 is positioned between a respective pair of rail brackets 10.

Figure 3:
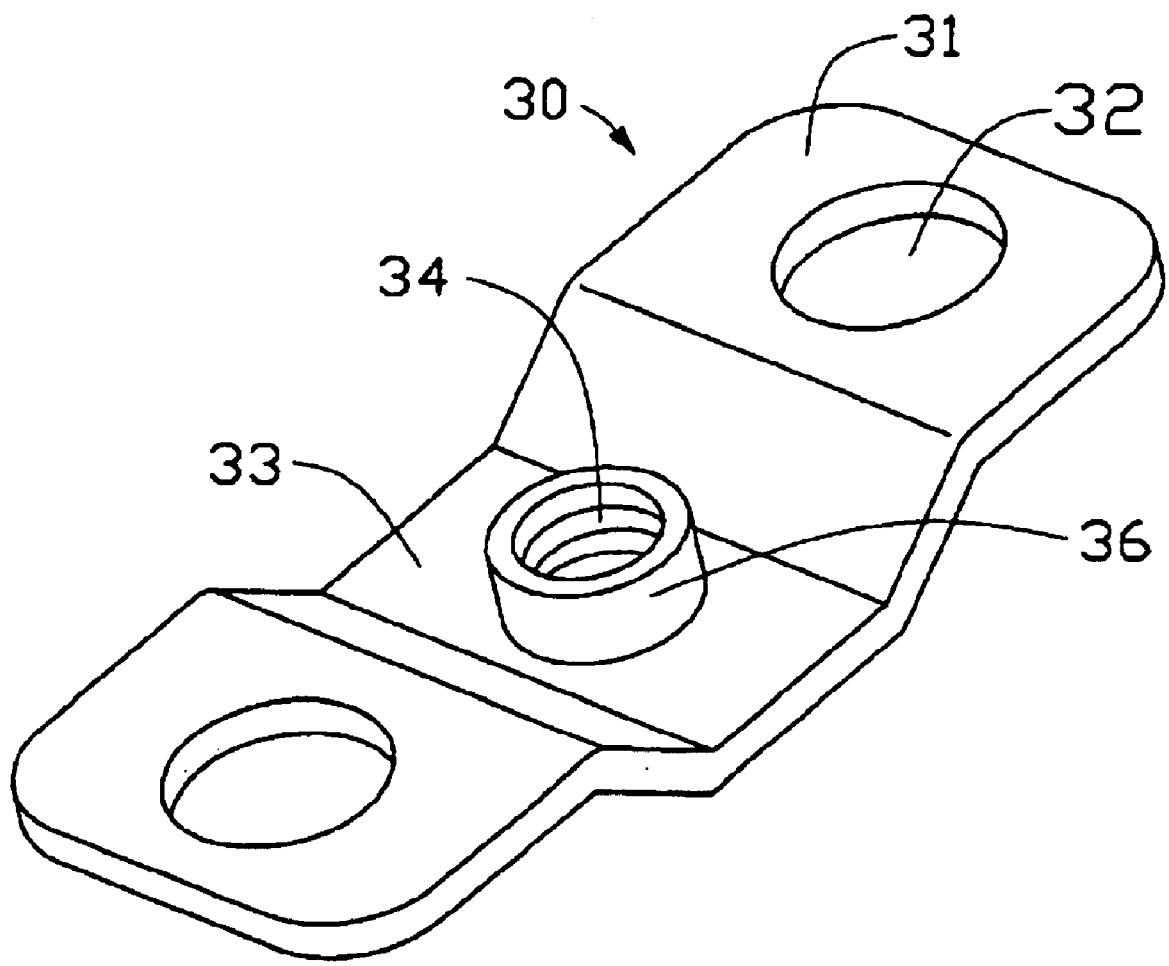
FIG. 3 is an enlarged, isometric view of one of the metal plates of FIG. 1, viewed from another aspect.

Referring to FIG. 3, each metal plate 30 comprises a base plate 31. The base plate 31 has an offset medial fixing portion 33. A second protrusion 36 projects from the fixing portion 33 toward a plane defined by the base plate 31. A threaded hole 34 is defined in the second protrusion 36. Two positioning holes 32 are defined in the base plate 31, at opposite sides of the fixing portion 33 respectively. A thickness of the base plate 31 is slightly less than an axial length of each first protrusion 14 of each rail bracket 10. A diameter of each positioning hole 32 is slightly greater than an outer diameter of each first protrusion 14.

The screws 80 are for being inserted through corresponding though holes 16 of the rail brackets 10 to engage in corresponding threaded holes 72 of the cabinet 70, thereby fastening the rail brackets 10 to the cabinet 70.

Figure 5:
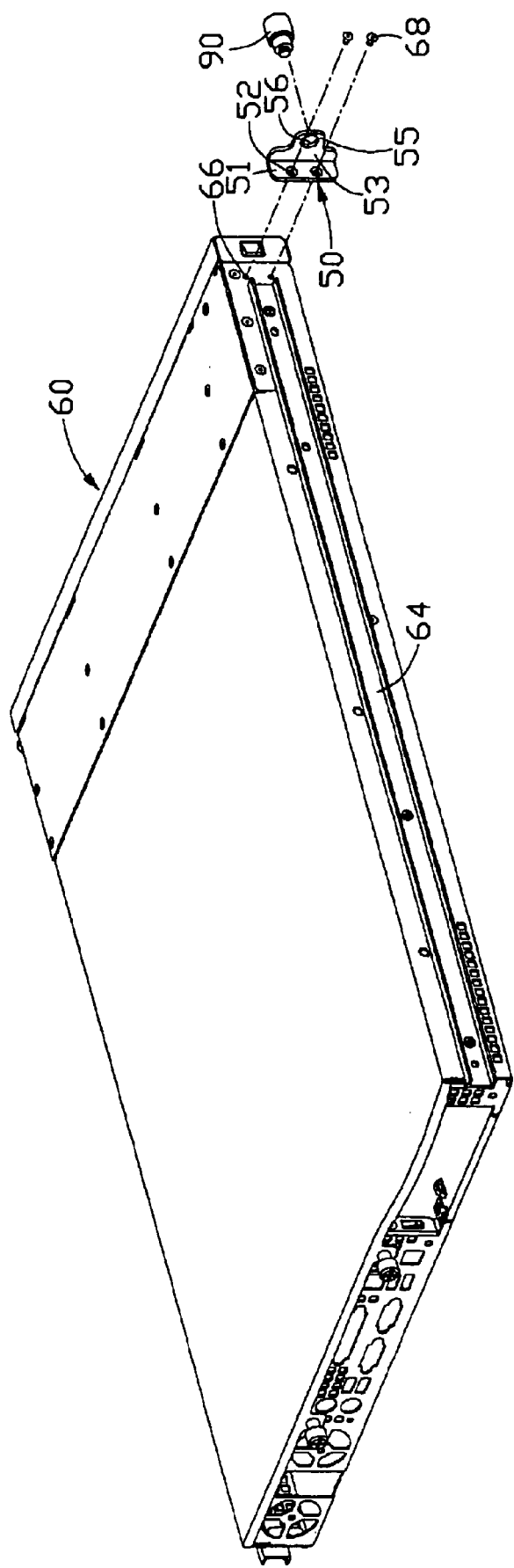
FIG. 5 is an exploded view of FIG. 4, but viewed from another aspect.

Referring to FIGS. 4 and 5, the second rail assembly comprises two inner rail parts 64 attached to opposite sides of the server 60 respectively. Two holes 66 are defined in each of the opposite sides of the server 60, near a front end of the server 60.

The fastening plates 50 are fixed to the opposite sides of the server 60 respectively. Each fastening plate 50 comprises a sidewall 51, and a front wall 53 extending from the sidewall 51. A pair of mounting holes 52 is defined in the sidewall 51. The front wall 51 comprises a narrowed medial end portion 55 distal from the sidewall 51. An inserting hole 56 is defined in the end portion 55. Two rivets are inserted through the mounting holes 52 of each fastening plate 50 and the holes 66 of a corresponding side of the server 60. The fastening plates 50 are thus fixed to the opposite sides of the server 60, near a front end of the server 60.

Figure 6:
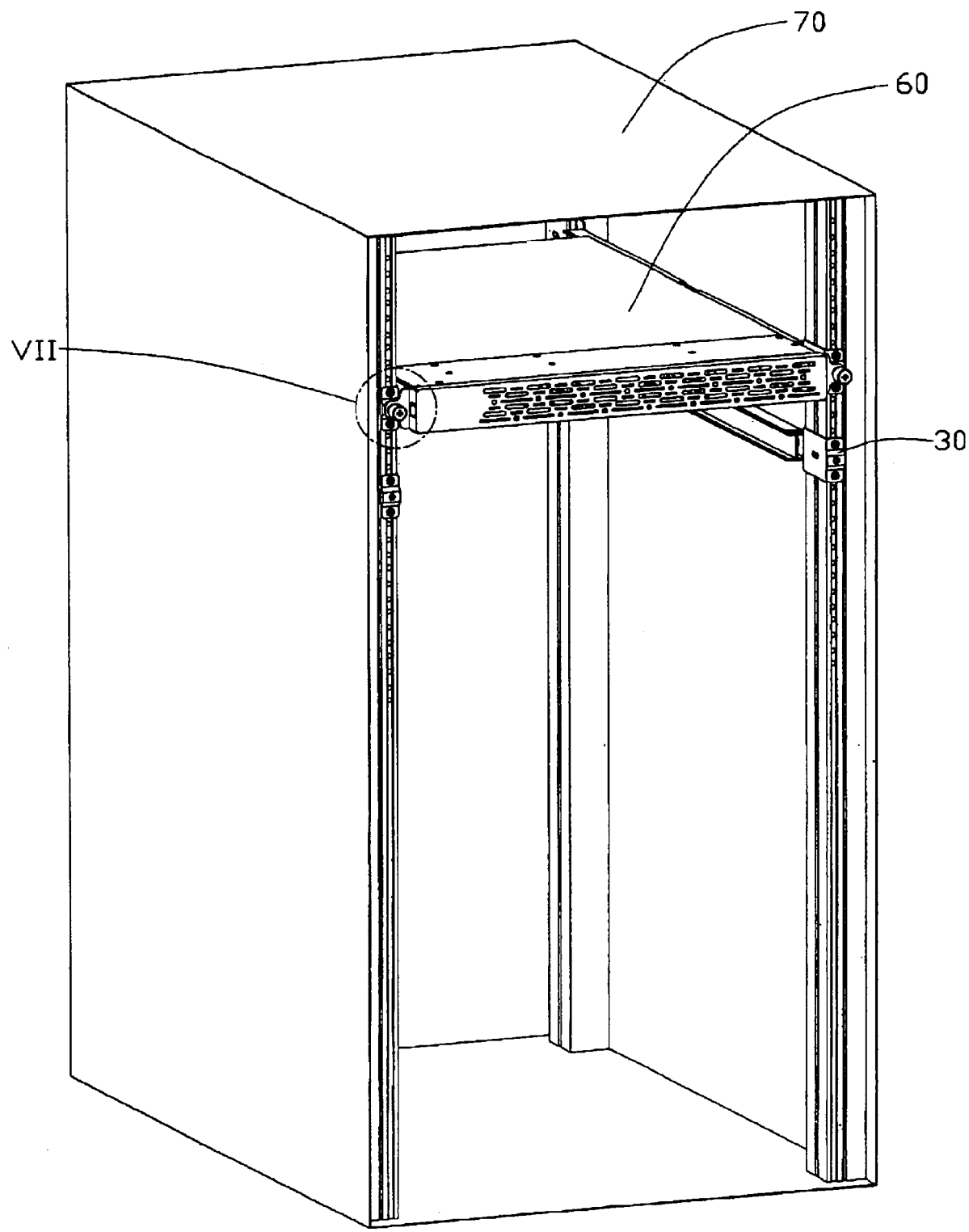
FIG. 6 is an assembled, isometric view of all the above-described parts of the retaining assembly in accordance with the preferred embodiment of the present invention.
Figure 7:
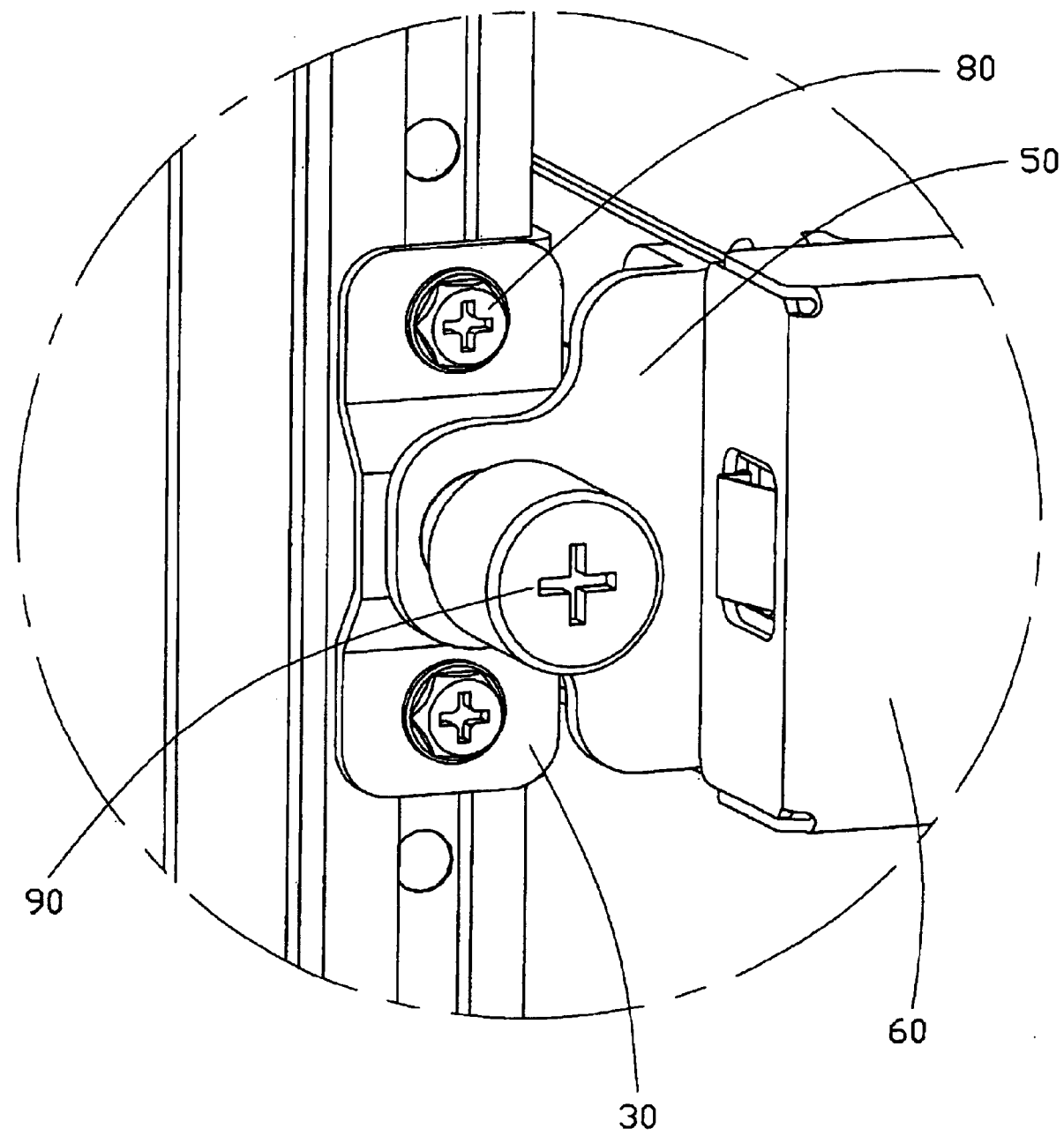
FIG. 7 is an enlarged view of a circled portion VII of FIG. 6.
Figure 8:
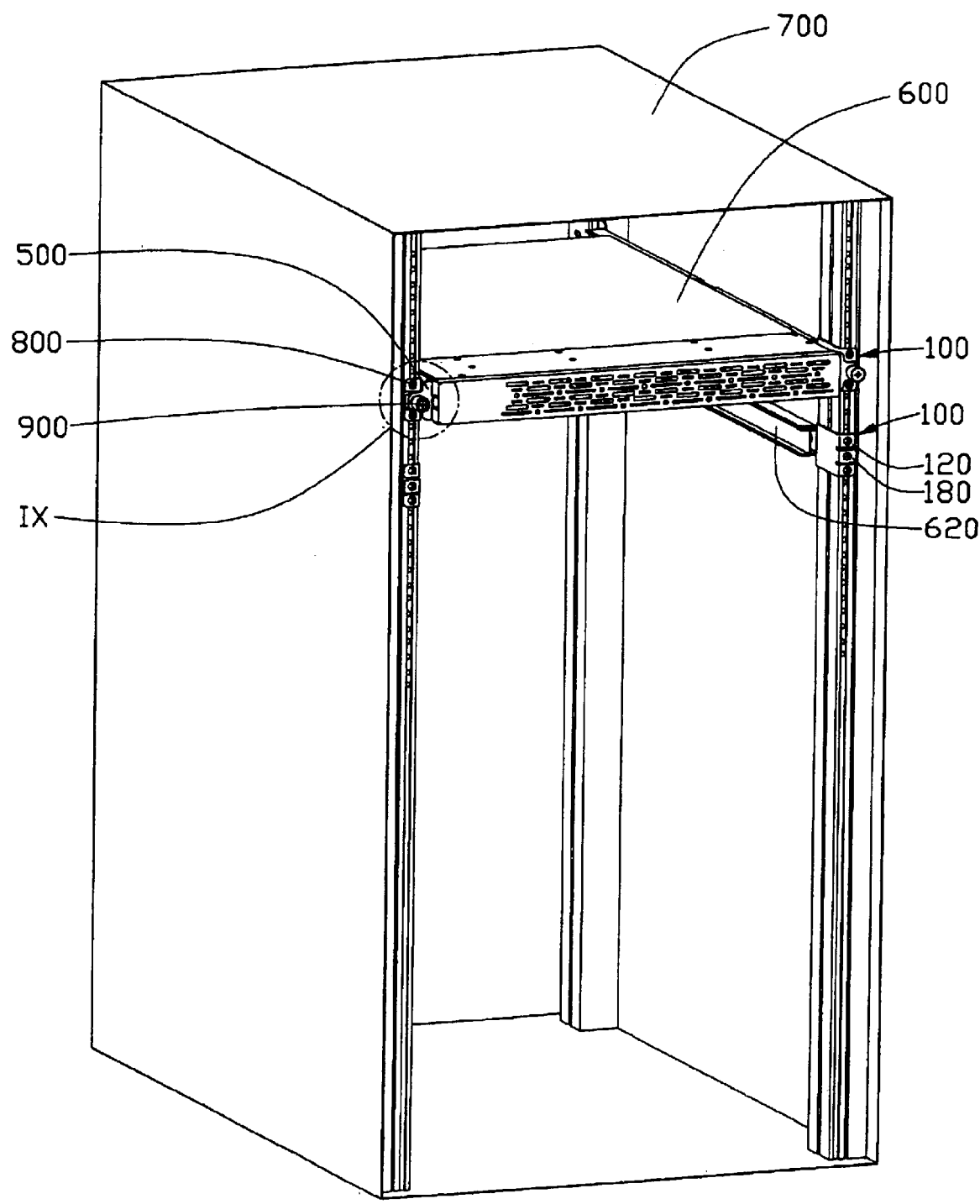
FIG. 8 is an assembled, isometric view of all parts of a conventional retaining assembly for a rack cabinet.
Figure 9:
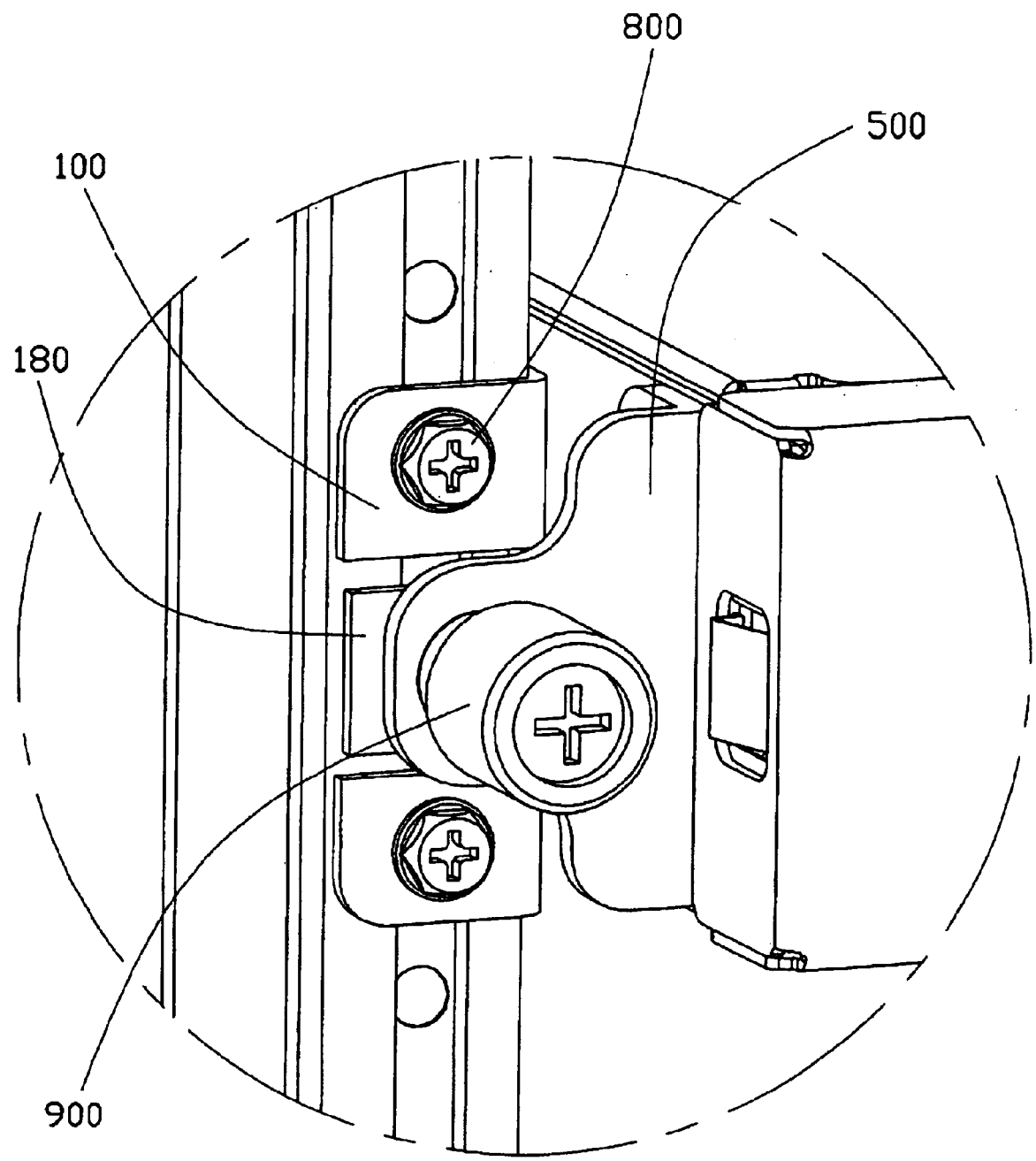
FIG. 9 is an enlarged view of a circled portion IX of FIG. 8.

Referring to FIGS. 6 and 7, in assembly of the retaining assembly, the group of rail brackets 10 of the first rail assembly is attached to the cabinet 70. The through holes 16 of each rail bracket 10 are aligned with corresponding threaded holes 72 of the cabinet 70. Then the metal plates 30 are engaged on the shoulders 12 of two rail brackets 10 that are located at the front portions of the sides of the cabinet 70. The first protrusions 14 of said rail brackets 10 are fittingly received in the positioning holes 32 of the metal plates 30. Two screws 80 are inserted through the though holes 16 of each rail bracket 10 to engage in the corresponding threaded holes 72 of the cabinet 70, thereby fastening the metal plate 30 and rail bracket 10 to the cabinet 70. One outer rail 62 is disposed between each said pair of rail brackets 10 at each respective side of the cabinet 70.

Then the server 60 is inserted into the cabinet 70, with the inner rail parts 64 sliding along the corresponding outer rails 62. When the server 60 is fully received in the cabinet 70, the inserting holes 56 of the fastening plates 50 are aligned with the fixing holes 34 of the corresponding metal plates 30.

Finally, the thumbscrews 90 are inserted though the corresponding inserting holes 56 of the fastening plates 50 to engage in the fixing holes 34 of the corresponding metal plates 30. Thus the server 60 is conveniently fastened in the cabinet 70 with the thumbscrews 90, instead of alternative means such as float screws. Because the thickness of the base plate 31 of each metal plate 30 is slightly less than the axial length of each first protrusion 14 of the corresponding rail bracket 10, and the diameter of each positioning hole 32 of each metal plate 30 is slightly greater than the outer diameter of said each first protrusion 14, the manufacturing and assembly tolerances can be relatively large and still allow correct assembly and functioning of the above-described combination. The thumbscrews 90 cooperate to provide the required assembly and functioning of the above-described combination, without the need for expensive float screws.

It is understood that the invention may be embodied in other forms without departing from the spirit thereof. Thus, the present example and embodiment is to be considered in all respects as illustrative and not restrictive, and the invention is not to be limited to the details given herein.

What is claimed is:

1. A retaining assembly comprising:
   a cabinet defining a plurality of threaded holes in both front and rear ends of two sidewalls thereof;
   a first rail assembly comprising two pairs of rail brackets located in said two sidewalls respectively, each pair of the rail brackets comprising two rail brackets located at front and rear potions of a respective sidewall;
   a pair of plates attached on corresponding rail brackets located at the front portions of the sidewalls respectively, each of the plates defining a fixing hole;
   a server having a second rail assembly attached to opposite sides thereof, the second rail assembly sliding along with the first rail assembly; the server further having a pair of fastening plates attached to said opposite sides thereof, each of the fastening plates defining an inserting hole corresponding to the fixing hole of a corresponding plate; and
   two manually manipulatable fasteners extending through corresponding inserting holes of the fastening plates and engaging in the fixing holes of corresponding plates.

2. The retaining assembly as claimed in claim 1, wherein each of the plates comprises a base portion and a fixing portion offset from the base portion.

3. The retaining assembly as claimed in claim 2, wherein the base portion defines positioning holes in opposite sides thereof, each of the rail brackets located at the front portions of the cabinet having first protrusions extend through the positioning holes of the plates respectively.

4. The retaining assembly as claimed in claim 3, wherein a thickness of the plates is slightly less than a height of each of the first protrusions, a diameter of each of the positioning holes is slightly greater than an outer diameter of each of the first protrusions.

5. The retaining assembly as claimed in claim 3, wherein each of the first protrusions defines a through hole therein aligned with a corresponding threaded hole.

6. The retaining assembly as claimed in claim 3, wherein the fixing portion of each of the plates has a second protrusion, and the fixing hole is defined in the second protrusion.

7. The retaining assembly as claimed in claim 2, wherein each of the fastening plates comprises a sidewall and a front wall extending from the sidewall.

8. The retaining assembly as claimed in claim 7, wherein the front wall of each of the fastening plates comprises an end portion received in the fixing portion of a corresponding plate, and the inserting hole is defined in the end portion.

9. The retaining assembly as claimed in claim 1, wherein the first rail assembly further comprises two outer rails each positioned between a respective pair of the rail brackets.

10. The retaining assembly as claimed in claim 9, wherein the second rail assembly comprises two inner rail parts corresponding to the outer rails.

11. A retaining assembly comprising:
   a cabinet assembly, having a cabinet, a first rail assembly located in the cabinet and a metal plate, a plurality of threaded holes being defined in two sidewalls of the cabinet, two first protrusions being provided in the first rail assembly, the metal plate comprising a base portion and a fixing portion, the metal plate having two positioning holes defined in two sides of the base portion and a fixing hole defined in the fixing portion, a thickness of the metal plate being less than a height of the first protrusions, a diameter of the positioning holes being slightly greater than an outer diameter of the first protrusions, the metal plate being attached to the first assembly with the first protrusions extending through the positioning holes;
   a second rail assembly adapted to be attached to a server and engaging with the first rail assembly for guiding the server into the cabinet;
   at least a fastening plate adapted to be attached to the server, the fastening plate having an inserting hole corresponding to the fixing hole of the metal plate; and at least a thumbscrew inserted through the inserting hole of the fastening plate to engage in the fixing hole of the metal plate.

12. The retaining assembly as claimed in claim 11, wherein the first rail assembly comprises two pairs of rail brackets located on the sidewalls of the cabinet respectively.

13. The retaining assembly as claimed in claim 12, wherein the first rail assembly of the cabinet assembly further comprises two outer rails provided in a respective pair of rail brackets.

14. The retaining assembly as claimed in claim 13, wherein the second rail assembly comprises two inner rail parts corresponding to the outer rails.

15. The retaining assembly as claimed in claim 11, wherein the fastening plate comprises a sidewall and a front wall extending from the sidewall, an end portion of the front wall being received in the fixing portion and the inserting hole being defined in the end portion.

16. The retaining assembly as claimed in claim 11, wherein two through holes are defined in said two first protrusions of the first rail assembly respectively engaging with two screws.

17. The retaining assembly as claimed in claim 16, wherein a second protrusion is defined in the fixing portion of the metal plate, and the fixing hole is defined in the second protrusion of the metal plate.

18. A retaining assembly comprising:
- a cabinet defining at least two spaced opposite side walls with a plurality of positioning holes formed in opposite front and rear edges thereof;
- a pair of rail brackets fastened to the corresponding positioning holes in each of said side walls so as to have said pair of rail brackets assembled to the front edge and the rear edge of each of said side walls;
- a pair of outer rails interconnecting to and aligned with the corresponding pairs of brackets in a front-to-back direction, respectively;
- a metal plate fastened to each of the brackets located on the front edge;
- a server defining on two sides a pair of inner rails slidable along the corresponding pair of outer rails; and
- a fastening plate being located in a front end of each of said two sides; wherein said fastening plate is fastened to the corresponding metal plate so as to assemble the server to the cabinet.

* * * * *